United States Patent
Dutartre et al.

(10) Patent No.: US 8,603,887 B2
(45) Date of Patent: Dec. 10, 2013

(54) METHOD FOR DEPOSITING A SILICON OXIDE LAYER OF SAME THICKNESS ON SILICON AND ON SILICON-GERMANIUM

(75) Inventors: Didier Dutartre, Meylan (FR); Nicolas Breil, Wappingers Falls, NY (US); Yves Campidelli, Le Moutaret (FR); Olivier Gourhant, Goncelin (FR)

(73) Assignees: STMicroelectronics S.A., Montrouge (FR); STMicroelectronics (Crolles 2) SAS, Crolles (FR); International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/560,348

(22) Filed: Jul. 27, 2012

(65) Prior Publication Data

US 2013/0072032 A1 Mar. 21, 2013

(30) Foreign Application Priority Data

Jul. 29, 2011 (FR) ...................................... 11 56990

(51) Int. Cl.
  *H01L 21/331* (2006.01)
(52) U.S. Cl.
  USPC ............ 438/363; 257/E21.182; 257/E21.207; 257/E21.409; 257/E21.632; 438/199; 438/938
(58) Field of Classification Search
  USPC ................... 257/E21.182, E21.207, E21.409, 257/E21.632; 438/199, 363, 938
  See application file for complete search history.

(56) References Cited

U.S. PATENT DOCUMENTS

2004/0070051 A1   4/2004  Sugiyama et al.
2007/0269963 A1*  11/2007 Cheng et al. ................... 438/479

OTHER PUBLICATIONS

French Search Report and Written Opinion dated Mar. 3, 2012 from corresponding French Application No. 11/56900.
Lee C.H., et al., *Negative Bias Temperature Instability Characteristics of Strained SiGe pMOSFETS*, Electronics Letters, IEE Stevenage, GB, vol. 43, No. 15, Jul. 19, 2007, pp. 835-836 XP006029386.
Bera L.K, et al., *A Dual-Strained CMOS Structure Through Simultaneous Formation of Relaxed and Compressive Strained-SiGe-on-Insulator*, IEEE Electron Device Letters, IEEE Service Center, New York, NY, vol. 27, No. 5, May 1, 2006, pp. 350-353, XP001546542.
Hugh, P.O., *Fundamentals of Chemical Vapor Deposition*, In: *Handbook of Chemical Vapor Deposition: Principles, Technology, and Applications*, Jan. 1, 1999, Noyes Publications, Norwich, New Your, XP55023475.

* cited by examiner

*Primary Examiner* — Asok K Sarkar
(74) *Attorney, Agent, or Firm* — Wolf, Greenfield & Sacks, P.C.

(57) ABSTRACT

A method for depositing a silicon oxide layer on a substrate including a silicon region and a silicon-germanium region, including the steps of: forming a very thin silicon layer having a thickness ranging from 0.1 to 1 nm above silicon-germanium; and depositing a silicon oxide layer on the substrate.

12 Claims, 4 Drawing Sheets

METHOD FOR DEPOSITING A SILICON OXIDE LAYER OF SAME THICKNESS ON SILICON AND ON SILICON-GERMANIUM

CROSS REFERENCE TO RELATED APPLICATIONS

This application claims the priority benefit of French patent application number 11/56990, filed on Jul. 29, 2011, which is hereby incorporated by reference to the maximum extent allowable by law.

BACKGROUND

1. Technical Field

Embodiments relate to the deposition of a silicon oxide layer of the same thickness on silicon regions and silicon-germanium regions (SiGe) of the same substrate. Embodiments more specifically relate to the deposition of a silicon oxide layer forming the gate insulator of P-channel MOS transistors on silicon-germanium and of N-channel MOS transistors on silicon.

2. Discussion of the Related Art

In integrated circuits, MOS transistors of various types are generally formed, especially MOS transistors with a low operating voltage and MOS transistors with a high operating voltage generally intended to be used for integrated circuit output stages.

For MOS transistors of high operating voltage, the gate insulator is provided to comprise a silicon oxide layer having a thickness on the order of 5 nm, while this thickness is only on the order of 2 nm for MOS transistors of low operating voltage. Thus, to form the silicon oxide of MOS transistors of high operating voltage, it is preferred to use silicon oxide deposition techniques while, for MOS transistors of low operating voltage, the silicon oxide is generally formed by thermal growth.

In CMOS ("Complementary Metal-Oxide-Semiconductor") technologies, to improve the characteristics of P-channel MOS transistors, a solution is to form the P-channel MOS transistors in an SiGe layer. In such technologies, deposition techniques have to be used to form a silicon oxide layer above silicon and above silicon-germanium, especially due to the different oxidation kinetics of Si and SiGe and to the segregation of Ge on the oxidation front.

FIGS. 1A to 1C illustrate successive steps of the forming of a gate insulator of an N-channel MOS transistor and of a P-channel MOS transistor, on a same substrate, in the case of MOS transistors of high operating voltage.

FIG. 1A is a cross-section view of the upper portion of a silicon substrate 1. In the upper portion of silicon substrate 1, insulation areas 3 delimit the regions where transistors are desired to be formed. Insulation areas 3, for example, are shallow trenches filled with silicon oxide, commonly designated as STI ("Shallow Trench Insulation").

The right-hand portion of FIG. 1A shows a region 5 on which an N-channel MOS transistor is desired to be formed and the left-hand portion of the drawing shows a region 7 on which a P-channel MOS transistor is desired to be formed. In region 7, a silicon-germanium to layer 9 which penetrates into silicon substrate 1 and reaches the same level has been formed.

FIG. 1B illustrates a step of deposition of a silicon oxide layer above the silicon and silicon-germanium regions of substrate 1. Before depositing the silicon oxide layer, a chemical cleaning of the upper surfaces of the Si and SiGe regions with hydrofluoric acid is performed, followed by an oxidizing bath, for example, in a sulfuric peroxide mixture (SPM). The chemical cleaning is especially used to remove possible contaminants present at the surface of silicon and of silicon-germanium. In the chemical cleaning, a silicon oxide layer 11, called chemical oxide, having a thickness smaller than 1 nm, generally forms above the Si and SiGe regions. After the chemical cleaning of the upper surfaces of the Si and SiGe regions, a silicon oxide layer 12 is deposited above chemical oxide layer 11, by low pressure chemical vapor deposition (LPCVD) or rapid thermal chemical vapor deposition (RTCVD).

FIG. 1C illustrates a step of forming, above silicon oxide layer 12, a stack 13 of insulating material layers, comprising one or several silicon nitride layers and materials of high dielectric permittivity. The forming of this stack, and especially of the silicon nitride layer, implies anneal steps at temperatures approximately ranging from 900 to 1000° C.

FIG. 2 is a diagram showing, for various trials, in abscissas, measurements ($e_{SiO2/Si}$) of the thickness, in angstroms or tenths of a nanometer, of the silicon oxide layer above the silicon regions and in ordinates, measurements ($e_{SiO2/SiGe}$) of the thickness of the silicon oxide layer above the silicon-germanium regions. The measurements have been performed once all the insulator forming and anneal steps have been carried out, respectively in the case where silicon oxide layer 12 has been deposited by an LPCVD method and in the case of an RTCVD method.

It can be observed in FIG. 2 that the silicon oxide thicknesses on silicon-germanium regions are greater than on silicon regions. It can also be observed that the silicon oxide thickness difference on the silicon and silicon-germanium regions is greater in the case where silicon oxide region 12 has been deposited by an LPCVD method than in the case of an RTCVD method. In the case of a silicon oxide layer 12 deposited by RTCVD, the silicon oxide thickness difference on silicon and silicon-germanium regions is approximately 0.2 nm, against more than 0.5 nm in the case of an LPCVD method.

Such thickness differences are considered as partly resulting from the initial chemical silicon oxide and partly resulting from the actual deposited silicon oxide.

The thickness differences of the silicon oxide layer on the silicon regions of N-channel MOS transistors and on the silicon-germanium regions of P-channel MOS transistors raise an to issue, since they result in differences in voltage behavior, leakage currents, and on-state current, and more generally in differences in terms of performance.

SUMMARY

Thus, an embodiment provides a method enabling to deposit substantially equal silicon oxide thicknesses on silicon and on silicon-germanium.

An embodiment provides such a method which enables to use tried and tested silicon oxide deposition techniques.

An embodiment provides such a method which is simple to implement.

An embodiment provides such a method which requires no passing through additional equipment with respect to a conventional method of deposition of a silicon oxide layer on a substrate comprising silicon regions and silicon-germanium regions.

An embodiment provides a method enabling to form a very thin silicon layer, formed at most of a few atomic monolayers, above silicon-germanium regions of a substrate.

An embodiment provides a method for depositing a silicon oxide layer on a substrate comprising a silicon region and a silicon-germanium region, comprising the steps of: forming a very thin silicon layer having a thickness ranging from 0.1 to 1 nm above silicon-germanium; and depositing a silicon oxide layer on the substrate.

According to an embodiment, the deposition of the silicon oxide layer is performed by chemical vapor deposition.

According to an embodiment, the deposition of the silicon oxide layer comprises a previous chemical cleaning step.

According to an embodiment, the silicon-germanium region is formed of a thin layer having its upper surface substantially at the same level as the upper silicon surface.

According to an embodiment, the very thin silicon layer is formed in an epitaxy chamber previously used to form the silicon-germanium region.

According to an embodiment, the method comprises the steps of: forming the silicon-germanium region in the presence of a germanium precursor and of a silicon precursor; and stopping the introduction of the germanium precursor to form the very thin silicon layer.

According to an embodiment, at step b), the temperature is decreased.

According to an embodiment, at step b), the introduction of the silicon precursor used at step a) is stopped and a silicon precursor containing more chlorinated species than the silicon precursor used as step a) is introduced.

According to an embodiment, at step b), HCl gas is added.

According to an embodiment, the temperature ranges between 550 and 650° C. during the step of forming of the silicon-germanium region, then ranges between 450 and 550° C. during the step of forming of the very thin silicon layer.

The foregoing and other objects, features, and advantages will be discussed in detail in the following non-limiting description of specific embodiments in connection with the accompanying drawings.

BRIEF DESCRIPTION OF THE DRAWINGS

As usual in the representation of integrated circuits, FIGS. 1A to 1C and 3A to 3D are not to scale.

DETAILED DESCRIPTION

FIGS. 3A to 3D illustrate successive steps of the forming of the gate of an N-channel MOS transistor and of a P-channel MOS transistor.

Figure 1A:
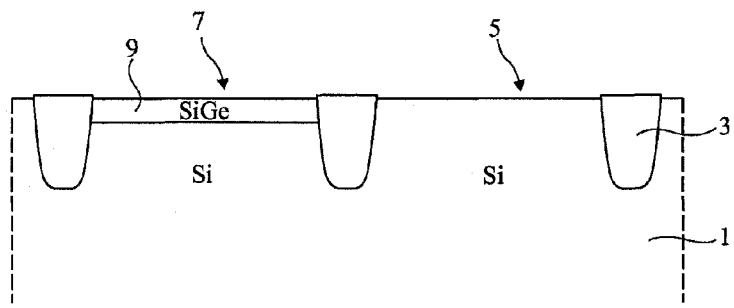
FIGS. 1A to 1C, previously described, are cross-section views illustrating successive steps of the forming of a gate insulator of an N-channel MOS transistor on silicon and of a P-channel MOS transistor on silicon-germanium.
Figure 1B:
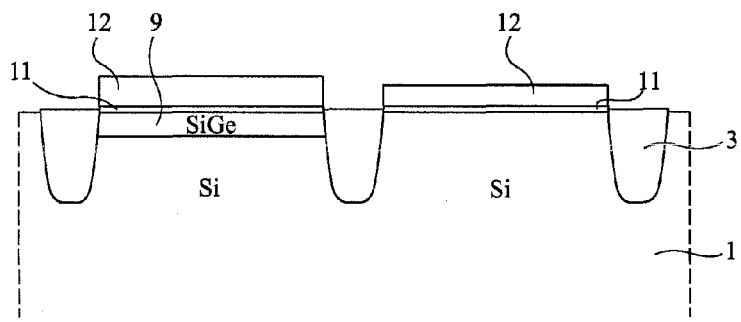
Figure 1C:
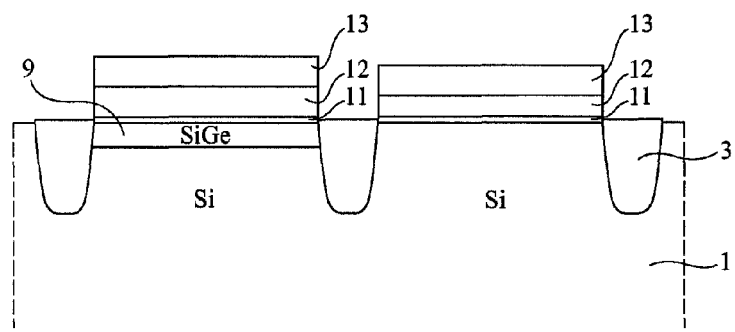
Figure 2:
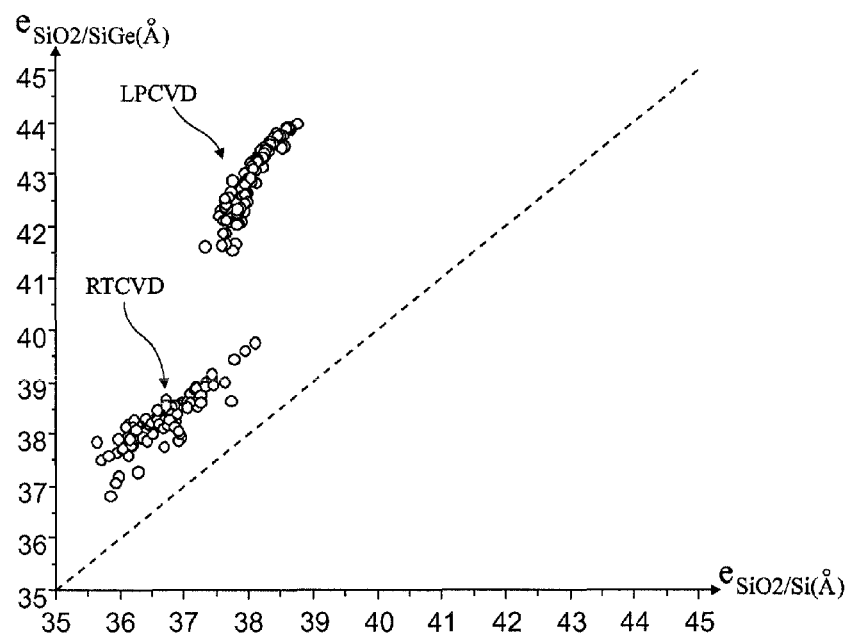
FIG. 2, previously described, is a diagram illustrating the thickness differences of a silicon oxide layer simultaneously deposited on silicon and on silicon-germanium.
Figure 3A:
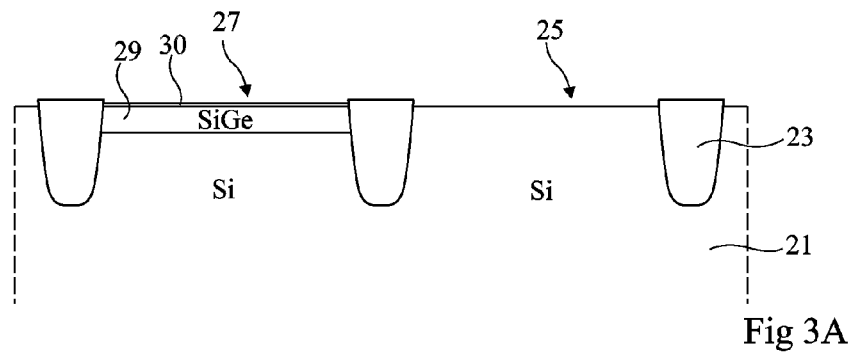
FIGS. 3A to 3D are cross-section views illustrating successive steps of simultaneous forming of the gate of an N-channel MOS transistor on silicon and of a P-channel MOS transistor on silicon-germanium.

FIG. 3A is a simplified cross-section view of a portion of a substrate 21, for example, a silicon substrate, comprising insulation areas 23 delimiting regions in which transistors are desired to be formed. The right-hand portion of FIG. 3A shows a region 25 on which an N-channel MOS transistor is desired to be formed, and its left-hand portion shows a region 27 on which a P-channel MOS transistor is desired to be formed. Regions 25 have been masked, after which the silicon of substrate 21 has been etched down to a given depth in regions 27. Then, above the upper surface of substrate 21, in the etched regions 27, a silicon-germanium layer 29 covered with a very thin silicon layer 30 has been formed. The thickness of the SiGe layer for example ranges between 4 and 10 nm, for example being on the order of 6.5 nm. The germanium proportion in the SiGe layer for example ranges between 20 and 40%. The thickness of very thin silicon layer 30 covering the SiGe layer approximately ranges from 0.1 to 1 nm, that is, the very thin silicon layer is formed of at most a few atomic monolayers. As shown, the depth of the recess formed in regions 27 may be adjusted so that, after the forming of silicon-germanium layer 29 covered with the very thin silicon layer, the upper surface of the silicon-germanium layer is substantially at the same level as the upper surface of the silicon of regions 25.

Figure 3B:
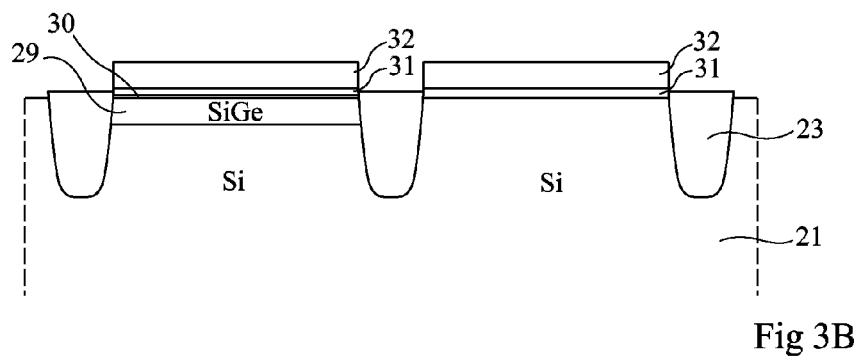

As illustrated in FIG. 3B, a next step comprises depositing a silicon oxide layer above the silicon-germanium regions covered with the very thin silicon layer and above the silicon regions of substrate 21. Before depositing the silicon oxide layer, a chemical cleaning of the upper surfaces of the Si and SiGe regions is performed with hydrofluoric acid, followed by an oxidizing bath, for example, in a sulfuric peroxide mixture (SPM). In the chemical cleaning, a very thin silicon oxide layer 31, called chemical oxide, having a thickness smaller than 1 nm, generally forms above the silicon regions and the silicon-germanium regions covered with the very thin silicon layer. After the chemical cleaning of the upper surfaces of the Si and SiGe regions, a silicon oxide layer 32 deposits above chemical oxide layer 31, generally by low pressure chemical vapor deposition (LPCVD) or rapid thermal chemical vapor deposition (RTCVD). The thickness of the silicon oxide layer formed of the chemical silicon oxide layer and of the actual deposited silicon oxide layer for example ranges between 4 and 6 nm, and for example is 5 nm.

Figure 3C:
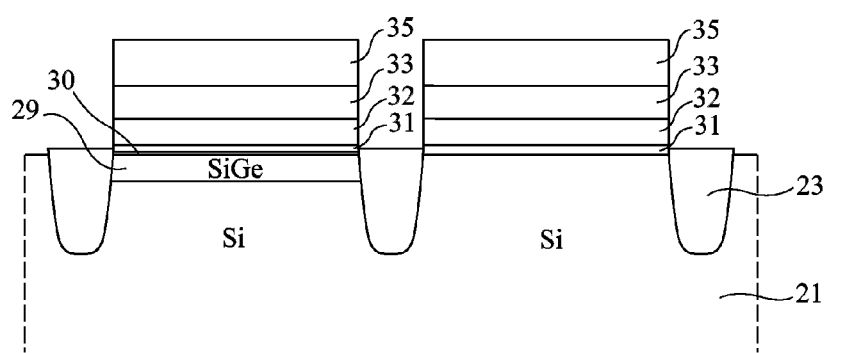

A next step, illustrated in FIG. 3C, comprises successively forming, above silicon oxide layer 32, various layers, for example, a stack 33 of layers of insulating materials, comprising one or several silicon nitride layers and materials of high dielectric permittivity, followed by a stack 35 of layers of conductive materials, comprising at least one layer of a metallic material.

Figure 3D:
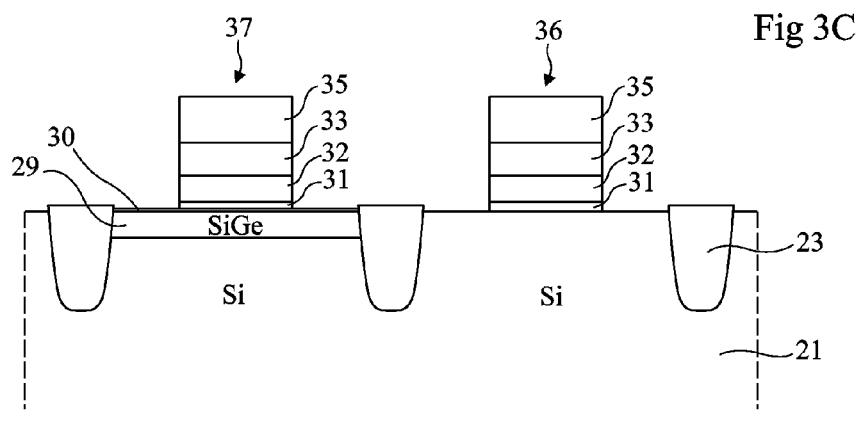

FIG. 3D illustrates a step of etching of layers 31, 32, 33, and 35 to define gates 36 of the N-channel MOS transistors and gates 37 of the P-channel MOS transistors.

After the gate definition step, conventional MOS transistor forming steps, especially generally comprising spacer forming steps followed by a source and drain area implantation to step and a contacting step, are carried out, with a possible intermediary siliciding of the source and drain areas.

A variation of a method of the type described in relation with FIGS. 3A to 3D comprises using hydrofluoric acid only for the chemical cleaning of the upper surfaces of the silicon and silicon-germanium regions before the deposition of silicon oxide layer 32. During such a chemical cleaning, no silicon oxide layer forms above the silicon regions and the silicon-germanium regions covered with the very thin silicon layer.

The applicants have measured the thickness of a silicon oxide layer simultaneously deposited on silicon and on silicon-germanium on which a very thin silicon layer has been previously formed, for different thicknesses of the very thin silicon layer. It can be observed that, with a very thin silicon layer having a thickness of 0.3, 0.5, or 0.8 nm, the thickness difference between silicon oxide on silicon and silicon oxide on silicon-germanium is decreased to less than 0.1 nm.

Thus, a method of the type described in relation with FIGS. 3A to 3D enables to deposit substantially equal silicon oxide thicknesses on silicon and on silicon-germanium, by tried and tested silicon oxide deposition methods. Further, the very thin silicon layer covering the silicon-germanium regions being formed at most of a few atomic monolayers, the advantages linked to silicon-germanium for P-channel MOS transistors are kept.

Further, a specific method for forming a very thin silicon layer, formed at most of a few atomic monolayers, above silicon-germanium regions of a substrate, is provided herein.

It is provided to form the very thin silicon layer in an epitaxy chamber previously used to form silicon-germanium regions of the substrate. Thus, in an epitaxy chamber, a silicon-germanium layer is first formed on silicon, preferably above a previously hollowed area of a silicon substrate. The silicon-germanium growth is performed in the presence of a germanium precursor, for example, germane ($GeH_4$), and a silicon precursor, for example, silane ($SiH_4$) or dichlorosilane ($H_2SiCl_2$). The substrate temperature during the forming of the SiGe layer for example ranges between 550 and 650° C. Once the SiGe layer has been formed, the introduction of the germanium precursor into the epitaxy chamber is stopped. A silicon layer then grows above the silicon-germanium layer. This growth becomes very slow as soon as the silicon layer reaches a thickness on the order of one atomic monolayer, and slower still if the substrate temperature is decreased, for example to a value ranging between 450 and 550° C. The process is thus self-limiting in a way.

Figure 4:
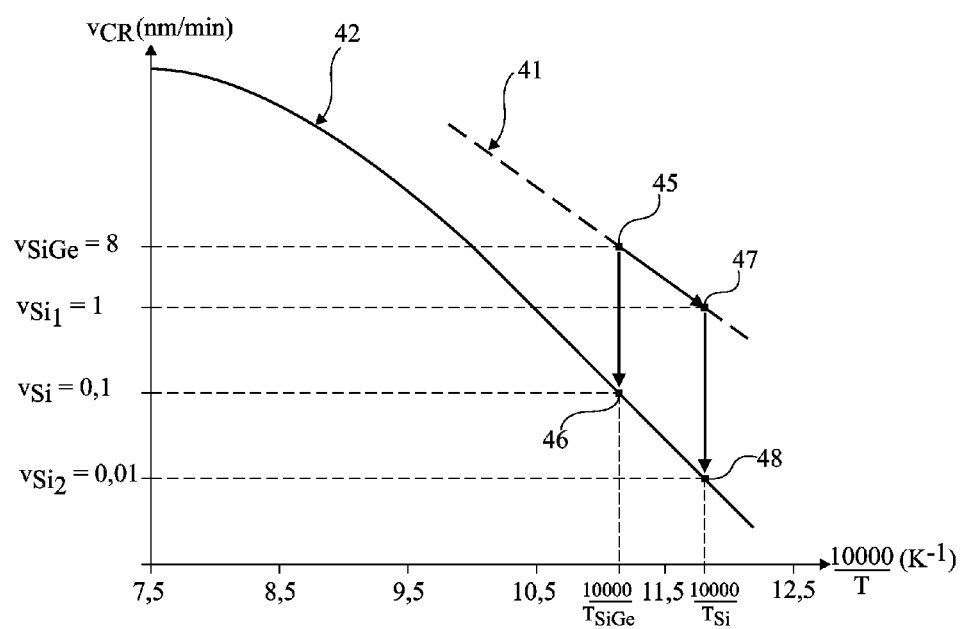
FIG. 4 is a diagram illustrating a self-limiting process used to form a very thin silicon layer on a silicon-germanium layer.

The used process is illustrated in FIG. 4. Curve 41 shows, according to the inverse of to temperature (1/T), the growth speed ($v_{cr}$) of Si or SiGe on SiGe, and curve 42 shows the growth speed of Si on Si. First, an operating temperature $T_{SiGe}$ enabling to have a SiGe growth speed, $v_{SiGe}$, allowing a sufficiently fast growth of the SiGe layer, for example, a growth speed on the order of 8 nm/min, is selected. This corresponds to operating point 45 on curve 41. Then, the incoming of the germanium precursor is interrupted. A silicon monolayer starts growing, and as soon as this silicon monolayer totally covers the silicon-germanium layer, it is passed to operating point 46 on curve 42, which characterizes growth speed $v_{Si}$ of silicon on silicon. Growth speed $v_{Si}$ is much lower than above-mentioned growth speed $v_{SiGe}$, for example, on the order of 0.1 nm/min. Given that this growth speed is very small, the process can be stopped after some time while being sure to have a layer of stable thickness from one sample to another.

To further slow down the growth speed of the very thin silicon layer, once the SiGe layer has been obtained, the incoming of the germanium precursor may be interrupted and the temperature may be lowered. It is then passed from operating point 45 to operating point 47 on curve 41 and the growth speed of silicon on silicon-germanium $v_{Si1}$ is on the order of 1 nm/min. As previously, once the silicon-germanium layer is totally coated with silicon, it is abruptly passed from operating point 47 on curve 41 to operating point 48 on curve 42, that is, the silicon growth speed (now on silicon) $v_{Si2}$ becomes very low, lower still than for operating point 46, for example, on the order of 0.01 nm/min. The process regulation then becomes even simpler.

To further slow down the silicon growth speed after the first silicon monolayer has been formed, different silicon precursors may be selected for the silicon-germanium layer growth, and then for the growth of the very thin silicon layer. For example, if the SiGe layer is obtained while the silicon precursor is silane, once this SiGe layer has been obtained, a mixture of silane and of HCl gas or dichlorosilane may be used for the growth of the very thin silicon layer. A mixture of dichlorosilane and of HCl gas may also be used if the SiGe layer is obtained while the silicon precursor is dichlorosilane.

An advantage of the method described in relation with FIGS. 3A to 3D is that it requires no passing through additional equipment to form the very thin silicon layer on the silicon-germanium regions of the substrate.

Specific embodiments have been described. Various alterations, modifications, and improvements will readily occur to those skilled in the art. In particular, substrate 21 may be to formed of a thin silicon layer formed on an insulating layer, itself generally formed on a silicon substrate, that is, substrate 21 may be a so-called SOI (silicon-on-insulator) substrate. In this case, insulating areas 23 join the underlying insulating layer.

Although a method for growing a very thin silicon layer on silicon-germanium in the specific context of the forming of CMOS transistors respectively on SiGe and on Si has been described herein, it should be understood that the self-limited method for growing a very thin silicon layer on silicon-germanium may be used in other applications.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for depositing a silicon oxide layer on a substrate, the substrate comprising a silicon region and a silicon-germanium region, the method comprising:
    forming, above the silicon-germanium region, a very thin silicon layer having a thickness between 0.1 and 1 nm;
    depositing, on the silicon layer and the silicon region, a silicon oxide layer; and
    wherein the silicon-germanium region is formed of a silicon-germanium layer having an upper surface substantially at a same level as an upper surface of the silicon region,
    wherein forming the silicon layer comprises forming the silicon layer in an epitaxy chamber previously used to form the silicon-germanium region.

2. The method of claim 1, wherein depositing the silicon oxide layer comprises depositing the silicon oxide layer by chemical vapor deposition.

3. The method of claim 1, further comprising, prior to depositing the silicon oxide layer, performing chemical cleaning.

4. The method of claim 1, further comprising:
    forming the silicon-germanium region in the epitaxy chamber in the presence of a germanium precursor and of a silicon precursor, wherein
    forming the silicon layer further comprises, after forming the silicon-germanium region, stopping introduction of the germanium precursor into the expitaxy chamber.

5. The method of claim 4, further comprising decreasing a temperature of the substrate prior to or during the forming of the silicon layer.

6. The method of claim 5, wherein the temperature of the substrate is between 550 and 650° C. during the forming of the silicon-germanium region, and wherein the temperature of the substrate is between 450 and 550° C. during the forming of the very thin silicon layer.

7. The method of claim 4, wherein the silicon precursor is a first silicon precursor, and wherein forming the silicon layer further comprises, after forming the silicon-germanium region:

stopping introduction of the silicon precursor into the epitaxy chamber, and introducing a second silicon precursor into the expitaxy chamber, the second silicon precursor being a more chlorinated silicon precursor species than the first silicon precursor.

8. The method of claim 4, wherein forming the silicon layer further comprises, after forming the silicon-germanium region, introducing HCl gas into the epitaxy chamber.

9. A method for depositing a silicon oxide layer on a substrate, the substrate comprising a silicon region and a silicon-germanium region, the method comprising:

forming, above the silicon-germanium region and at a rate less than or equal to 0.1 nm/minute, a silicon layer having a thickness between 0.1 and 1 nm;

depositing, on the silicon layer and the silicon region, a silicon oxide layer; and wherein the silicon-germanium region is formed of a silicon-germanium layer having an upper surface substantially at a same level as an upper surface of the silicon region.

10. The method of claim 9, wherein forming the silicon layer at the rate less than or equal to 0.1 nm/minute comprises forming the silicon layer at a rate less than or equal to 0.01 nm/minute.

11. The method of claim 9, wherein forming the silicon layer at the rate less than or equal to 0.1 nm/minute comprises forming the silicon layer at a rate between 0.01 nm/minute and 0.1 nm/minute.

12. The method of claim 9, wherein forming the silicon layer comprises forming the silicon layer in an epitaxy chamber previously used to form the silicon-germanium region.

\* \* \* \* \*

UNITED STATES PATENT AND TRADEMARK OFFICE
CERTIFICATE OF CORRECTION

| | | |
|---|---|---|
| PATENT NO. | : 8,603,887 B2 | Page 1 of 1 |
| APPLICATION NO. | : 13/560348 | |
| DATED | : December 10, 2013 | |
| INVENTOR(S) | : Didier Dutartre et al. | |

It is certified that error appears in the above-identified patent and that said Letters Patent is hereby corrected as shown below:

In the Specification
Col. 1, line 60 should read:
region 7, a silicon-germanium layer 9 which penetrates into Col. 2, line 45 should read:
raise an issue, since they result in differences in voltage Signed and Sealed this
Eleventh Day of March, 2014

Michelle K. Lee
*Deputy Director of the United States Patent and Trademark Office*